(12) United States Patent
Samuels et al.

(10) Patent No.: US 6,947,710 B2
(45) Date of Patent: Sep. 20, 2005

(54) TRANSMITTER

(75) Inventors: John Samuels, Ash Vale (GB); Christopher Callender, Fleet (GB)

(73) Assignee: Nokia Corporation, Espoo (FI)

( * ) Notice: Subject to any disclaimer, the term of this patent is extended or adjusted under 35 U.S.C. 154(b) by 446 days.

(21) Appl. No.: 10/183,491

(22) Filed: Jun. 28, 2002

(65) Prior Publication Data

US 2003/0003882 A1 Jan. 2, 2003

(30) Foreign Application Priority Data

Jun. 29, 2001 (GB) .............................. 0115999

(51) Int. Cl.[7] .......................... H04B 1/034; H04C 1/52
(52) U.S. Cl. ................... 455/95; 455/108; 375/298
(58) Field of Search ........................ 455/91, 95, 108, 455/110, 114.2, 115.1, 118, 127.1; 375/146, 295, 296, 297, 298, 300, 302, 303; 370/335, 342

(56) References Cited

U.S. PATENT DOCUMENTS

| 6,014,065 A | | 1/2000 | Nishikawa | |
| 6,044,117 A | * | 3/2000 | Muto | .................. 375/295 |
| 6,515,961 B1 | * | 2/2003 | Weaver et al. | .............. 375/146 |

FOREIGN PATENT DOCUMENTS

| EP | 0 689 323 A2 | 12/1995 |
| EP | 0 874 501 A2 | 10/1998 |
| EP | 1 081 851 A2 | 3/2001 |
| EP | 1 094 614 A2 | 4/2001 |
| GB | 2 239 770 A | 7/1991 |
| GB | 2 317 795 A | 4/1998 |
| GB | 2 320 827 A | 7/1998 |
| GB | 2 346 773 A | 8/2000 |
| WO | WO 99/63723 A1 | 12/1999 |
| WO | WO 00/54426 | 9/2000 |

OTHER PUBLICATIONS

Communication from the European Patent Office transmitting the European Search Report dated Nov. 2, 2004.

* cited by examiner

*Primary Examiner*—Quochien B. Vuong
(74) *Attorney, Agent, or Firm*—Antonelli, Terry, Stout & Kraus, LLP

(57) ABSTRACT

A transmitter is disclosed. The transmitter has an RF portion having an amplifier for amplifying a signal for transmission. The RF portion is fed by a baseband portion. The baseband portion comprises: means for generating a pair of in-phase (I) and quadrature-phase (Q) data signals; and a limiter arrangement for preventing the amplitude of both the I and Q data signals exceeding a preternined level.

33 Claims, 5 Drawing Sheets

TRANSMITTER

BACKGROUND OF THE INVENTION

1. Field of the Invention

This invention relates to a transmitter for use in a radio system operable according to a non-constant envelope modulation scheme—particularly the Wideband Code Division Multiple Access (WCDMA) standard. It finds particular, but not exclusive utility in a radio system employing both Time Division Duplex (TDD) and Frequency Division Duplex (FDD). However, it also provides benefits in a system employing only one of these, or other, technologies.

2. Description of the Prior Art

WCDMA technology is being used to provide access to third generation (3G) mobile telecommunication systems. Two particular variants of WCDMA are TDD and FDD. FDD is intended to be used for macrocellular applications, and splits the transmit and receive bands into two distinct frequency spectra. A possible application for TDD is in micro- and pico-cellular applications. TDD splits the transmit and receive channels on a timeslot basis—each residing on the same physical channel. TDD is better suited to applications requiring different bandwidths in the uplink and downlink directions, as the amount of bandwidth allocated in each direction can be dynamically varied. In this way, a user who is web browsing, for instance, can have more timeslots allocated to the downlink, while receiving more data than being sent.

The standards and regulations governing devices operating according to WCDMA specify certain key parameter ranges within which all compliant devices must operate. One key signal quality metric is Adjacent Channel Leakage Ratio (ACLR). This metric gives a measure of the interference experienced on a channel adjacent to that currently being used for transmission. A primary cause of poor ACLR performance is operation of the transmitter's power amplifier (PA) in a non-linear region. Use of a PA having an insufficient dynamic range can result in the output signal from the PA being compressed. Such compression will spread the output spectrum of the PA. This spreading can leak through into adjacent channels, resulting in poor ACLR performance.

Prior art PAs address this problem by specifying the PA to operate in a linear region for all output powers of the PA. Achieving linear performance from PAs requires them to be operated in an inefficient manner i.e. the ratio of RF Power out, to DC power in to the PA, is poor. This arrangement, which has thus far been required in order to comply with the operating standards, has resulted in PAs which require high currents from the device power supply. For mobile devices, this consequently leads to poor battery life, which has an impact on talk time. In the case of base stations, the operating costs associated with inefficient power supplies can be sizeable.

WCDMA signals typically have a high peak to average ratio (PAR). This means that the peak signal from the PA can sometimes be several dB higher than the average signal. In prior art transmitters, the PA must be operable in a linear fashion across this entire range. This results in inefficiencies as described previously. The highest value of PAR experienced in a system is defined as the 'crest factor'.

It is desirable to reduce the crest factor, and thus the difference between the peak and the average output power from the PA.

SUMMARY OF THE INVENTION

According to a first aspect of the present invention there is provided a transmitter comprising a RF portion having an amplifier for amplifying a signal for transmission, the RF portion being fed by a baseband portion, wherein the baseband portion comprises; means for generating a pair of in-phase (I) and quadrature-phase (Q) data signals; and a limiter arrangement for preventing the amplitude of both the I and Q data signals exceeding a predetermined level.

Embodiments of the invention act to reduce the crest factor associated with non-constant envelope modulation schemes. Particular embodiments are described relating to WCDMA systems, but the principles can be applied equally to other relevant communication standards.

Compression of the signal from the PA of a transmitter can cause spurs to appear in the output spectrum. Embodiments of the invention seek to address this problem by deliberately clipping the data signals in the baseband portion of the transmitter. Such clipping has the effect of reducing the dynamic range over which the PA must operate. This allows the PA to be specified to operate in a more linear region, and so reduces the likelihood of compression affecting the transmitted signal.

As described previously, there are two particular variants of WCDMA: FDD and TDD. TDD uses QPSK (Quadrature Phase Shift Keying), and has a particular crest factor. FDD uses a slightly different modulation scheme known as HPSK (Hybrid Phase Shift Keying) on the uplink signals. This has an associated different crest factor.

However, it is expected that dual-mode TDD/FDD handsets and base stations will be available, and in a desire to minimize component count, a common PA will be used, which must be operable under a worst-case condition.

The clipping can be carried out on the I and Q data signals directly. A suitable means for performing this operation is a limiter.

Alternatively, the I and Q data signals may be converted for clipping purposes. A preferred embodiment converts the I and Q data signals into corresponding polar co-ordinates. In this way, the magnitude signal may be limited, re-combined with the phase signal, and converted back into I and Q data signals for onward processing.

Preferably, the baseband portion of the transmitter is implemented using ASIC technology, preferably using a single device.

The problem of transmitter inefficiency addressed by embodiments of the invention is experienced in both handsets and base stations. In handsets, the inefficiency leads to shorter than desirable talk times. In base stations, the inefficiency leads to higher running costs. As such, embodiments of the invention may be usefully employed in either setting.

BRIEF DESCRIPTION OF THE DRAWINGS

For a better understanding of the present invention, and to understand how the same may be brought into effect, the invention will now be described, by way of example only, with reference to the appended drawings in which.

DESCRIPTION OF THE PREFERRED EMBODIMENTS OF THE INVENTION

Figure 1:
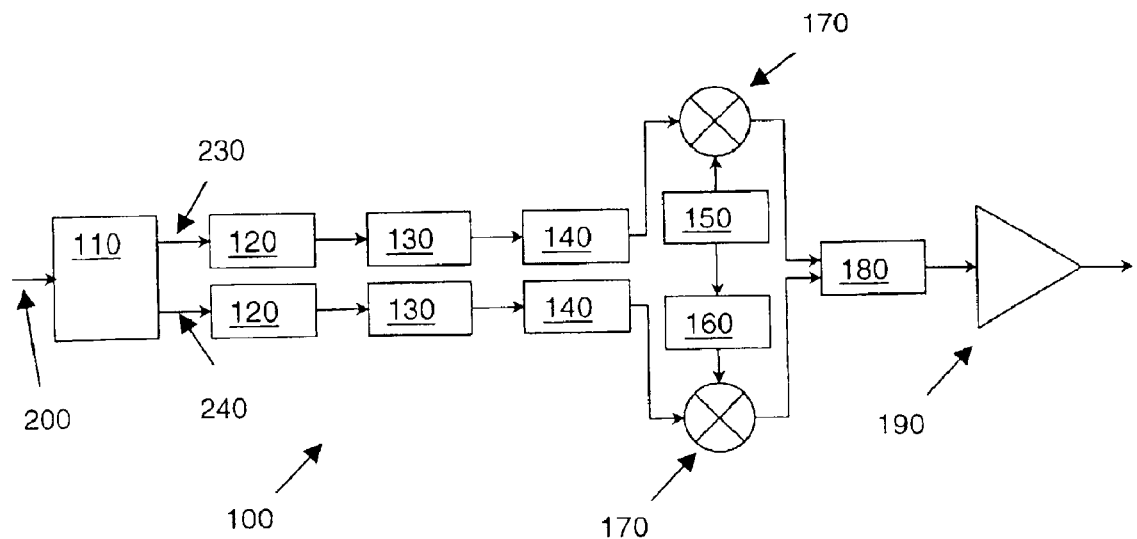
FIG. 1 shows a prior art WCDMA transmitter.

A prior art WCDMA transmitter 100 is shown at FIG. 1. This is well known, but for the sake of completeness, a brief summary is provided.

The input to the system is DPCH 200. DPCH is an acronym for Dedicated Physical Channel, and its constituents are different depending on whether FDD or TDD is used.

DPCH 200 is fed into the WCDMA spreading function 110, where encoding occurs to yield digital I 230 and Q 240 output signals. These are next fed into digital Root Raised Cosine (RRC) filters 120 for pulse shaping. The outputs of these filters are fed into Digital to Analog Converters (DACs) 130 for conversion into analog signals suitable for transmission.

The outputs from the DACs 130 are next fed into analog reconstruction filters 140, which smooth the outputs of the DACs in preparation for mixing to the transmission frequency in mixers 170. One of the mixers 170 is also fed with a carrier signal from synthesizer 150. The other mixer 170 is fed with a 90° phase shifted version of the carrier signal from phase shifter 160.

The outputs from the two mixers 170 are fed into a summer 180 to combine the signals. The output from summer 180 is fed into the PA 190 and is fed into an antenna, possibly via one or more filters. The PA 190 may be preceded by a transmit pre-amplifier (not shown).

The digital portion of the transmitter 100 is commonly referred to as the baseband portion.

As described previously, the PA is configured to avoid compressing the output signal, as this seriously degrades the ACLR performance metric.

Figure 2:
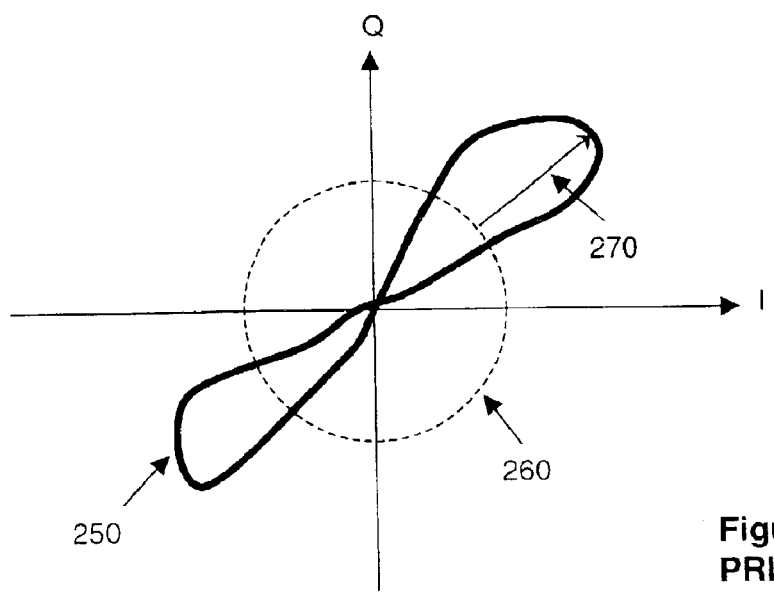
FIG. 2 shows a typical output trajectory from the transmitter of FIG. 1.

FIG. 2 shows a typical signal trajectory corresponding to a transmission from the transmitter 100 of FIG. 1. The signal trajectory 250 is shown in customary fashion on I-Q axes. The dotted circle 260 represents the average power transmitted by the PA 190 over a prolonged period. The crest factor may be represented by the furthest distance between the signal trajectory outside the circle and the circle. In this instance, the arrow 270 indicates the peak power above the average power. This power which is required above the average leads to the PA being run in an inefficient mode as previously described.

Figure 3:
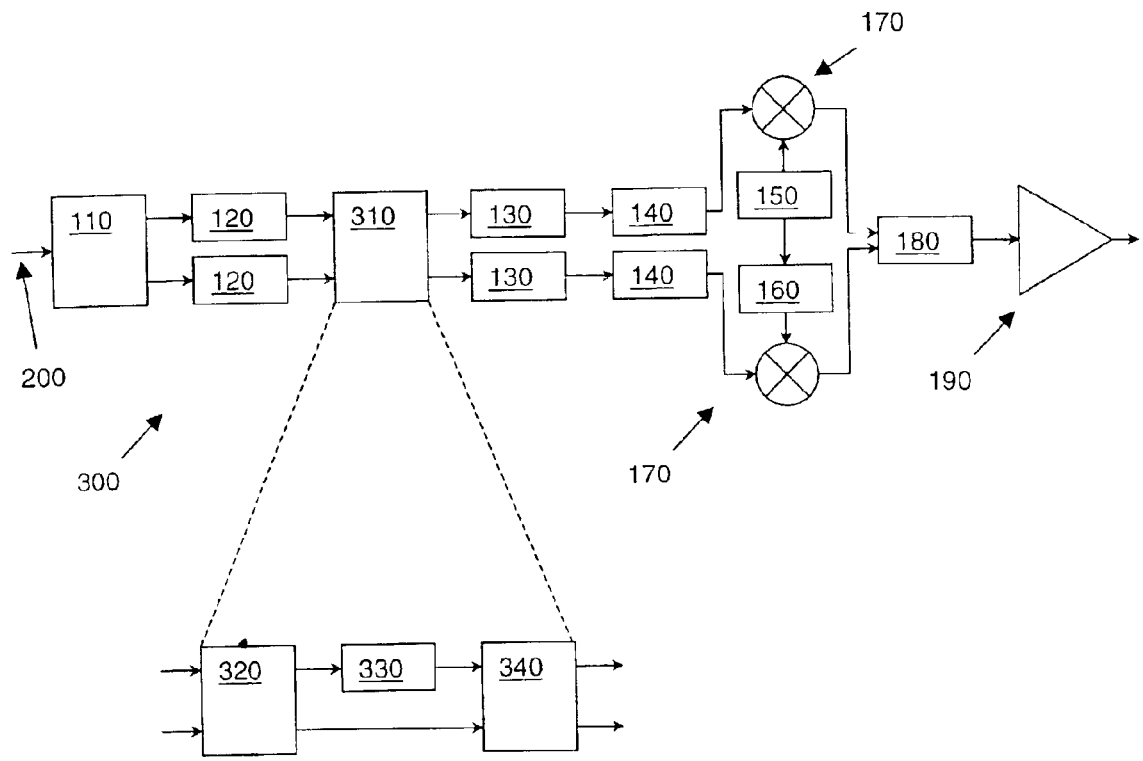
FIG. 3 shows a transmitter according to an embodiment of the invention.

FIG. 3 shows an embodiment of the invention comprising an additional functional module 310 in the baseband portion of the transmitter 300. The like numbered components of transmitters 100 and 300 are identical.

Module 310 is shown in more detail in FIG. 3 to comprise three functional parts. The two inputs to module 310 are I and Q data signals. Module 320 is a rectangular to polar co-ordinate translator. It takes the I & Q data signals and converts them into two data signals representing amplitude and phase.

The amplitude signal is input to module 330. Module 330 acts as a limiter according to a single rule. The rule is that if the input signal exceeds a certain threshold then the output equals that threshold, else the output is identical to the input. In this way, the signal from module 330 never exceeds the threshold, but if the input is lower than the threshold, it passes through intact.

The clipped amplitude data output from module 330 is combined with the untouched phase data from module 320 in module 340. Module 340 converts the clipped amplitude and phase data into rectangular, i.e. I & Q, coordinates for applying to DACs 130.

Figure 4:
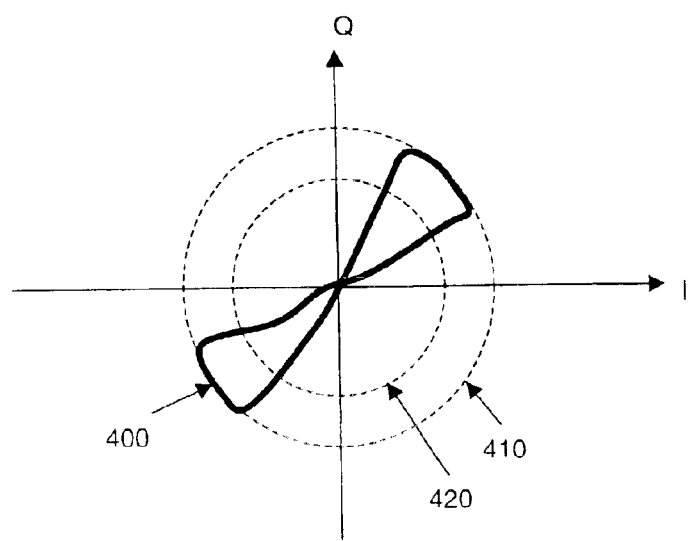
FIG. 4 shows a typical output trajectory from the transmitter of FIG. 3.

The effect that this has on the output trajectory is shown in FIG. 4. In contrast to the output trajectory shown in FIG. 2, it can be seen clearly that the trajectory 400 of FIG. 4 is clipped so as to never exceed a threshold as defined by the dotted circle 410. Circle 420 illustrates the average power transmitted.

This reduction in peak output power has the effect of lowering the crest factor, which means that the PA can be operated in a more efficient manner as described.

An alternative embodiment of the invention carries out the baseband clipping task without first converting the transmit signals into polar form. Digital signal processors are better suited to performing mathematical threshold functions, as compared to mathematical functions used to convert between rectangular and polar co-ordinates.

Figure 5:
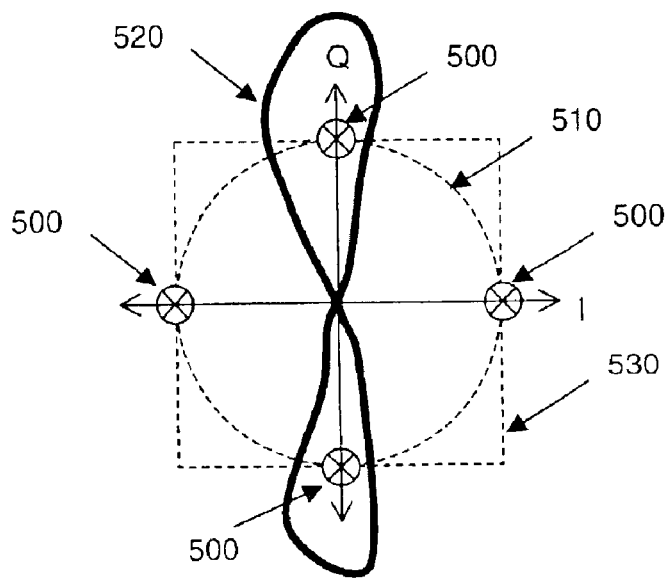
FIG. 5 shows an output trajectory/constellation diagram for a QPSK system.

FIG. 5 shows an ideal constellation diagram for a QPSK system. The important points are, of course, the points 500 lying on the respective I and Q axes. The ideal output trajectory lies inside the circle 510. However, due to non-idealities in the transmit chain, the output trajectory can stray outside the ideal circle.

Rather that convert the I/Q data into polar data for clipping purposes, an alternative technique can clip the I and Q signals directly. The limits of such a clipper/limiter are as shown by the dotted square 530. Any I signal exceeding the limit defined by the right or left hand side of the square are limited to the threshold level. Likewise for any Q signal exceeding the upper or lower side of the square.

In this way, the I and Q signals, present in any case in the transmitter, can be clipped directly, without requiring conversion to polar coordinates first. The net effect is the same, in that the baseband clipping introduced directly lowers the crest factor of the transmitted signal.

Figure 6A:
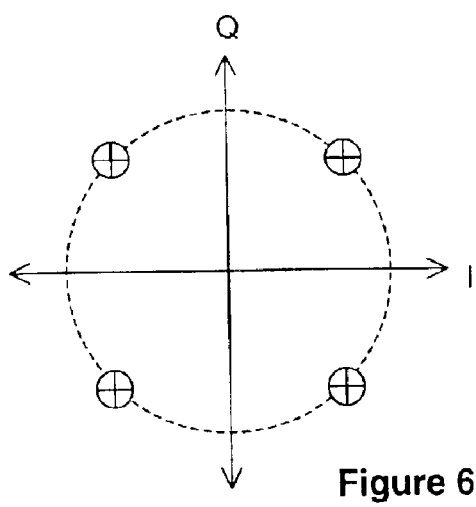
FIGS. 6a and 6b represent alternative forms of QPSK systems.

An alternative spreading scheme places the constellation points as shown in FIG. 6a. In this case, it is not simply a matter of limiting the I and Q signals directly, as they are offset from the axes by 45°. It is necessary to rotate the signals by 45°, i.e. apply a phase shift, before the signals are limited as before. Depending on the system in use, it may or may not be necessary to rotate the signals back to their original positions.

Figure 6B:
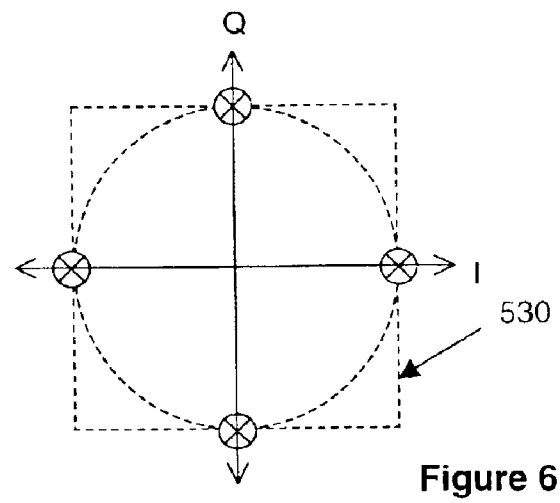

FIG. 6b shows the effect of applying a phase shift of 45° to the I and Q signals. The constellation points have been shifted to the axes, and the clipping limit is again illustrated by dotted square 530. The situation now resembles the situation previously described with respect to FIG. 5.

Figure 7:
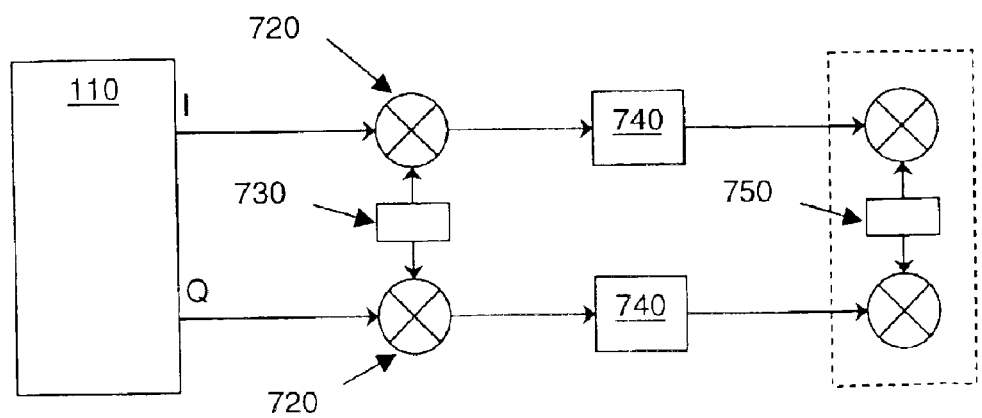
FIG. 7 shows part of an alternative embodiment of the invention.

A suitable arrangement for providing the necessary phase shift is shown in FIG. 7. WCDMA spreading is performed in module 110 to yield digital I and Q signals. In order to phase shift these by 45°, it is necessary to mix them with a signal having the requisite phase characteristics. This signal is produced by multiplying the I and Q signals, in multipliers 720, with a signal from module 730.

The result of the multiplication process is to shift the constellation points around by 45°, thus placing them on the axes of the constellation diagram as shown in FIG. 6b. The limiters 740 act to pass any signal below a certain defined threshold, and to clip any signal exceeding that threshold. The resultant signals can then be fed into the remainder of the transmit chain as shown in FIG. 3 from DACs 130 onwards, or alternatively, the signals can be phase shifted back to their original positions by mixing with a signal from module 750 giving a phase shift of −45°.

The same principle can be adopted for signals having more than 4 constellation points.

There is a compromise to be struck in opting to clip the signals in the baseband. The output signal is altered compared to that previously obtained from a WCDMA transmitter. The effect of this is to degrade the ACLR performance, and the Error Vector Magnitude (EVM) performance. EVM gives a measure of the error rate of the transmitter, in terms of mean distance of a transmission from the ideal constellation points.

Provided that the clipping which is introduced degrades the ACLR without taking the transmitter out of the acceptable range for EVM performance, then some degree of baseband clipping is acceptable. The exact amount of clipping which can be introduced is dependent on the exact specification with which the transmitter is operating, and may be determined empirically or with simulations in each case.

Figure 8:
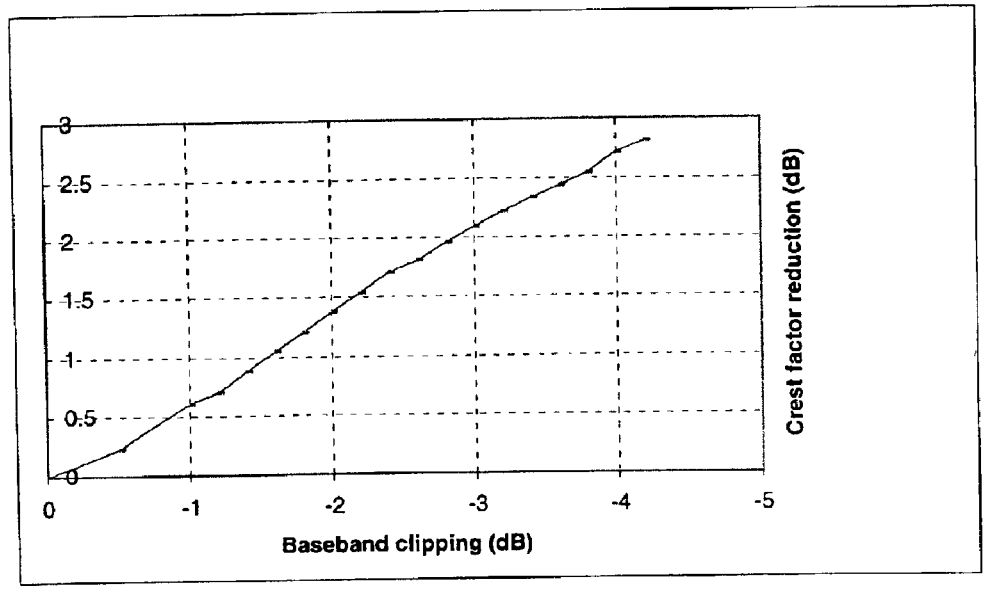
FIG. 8 shows a graph relating the reduction in crest factor associated with different degrees of baseband clipping.

FIG. 8 shows a graph of the typical reduction in crest factor which may be achieved through the use of baseband clipping at various levels. As can be seen, introducing baseband clipping of 3db can reduce the crest factor by 2 dB. This scale of reduction in crest factor can allow significant improvements in the efficiency of the PA, resulting in improved talk times from a given battery in a hand-held device, and lower running costs for a base station.

Figure 9:
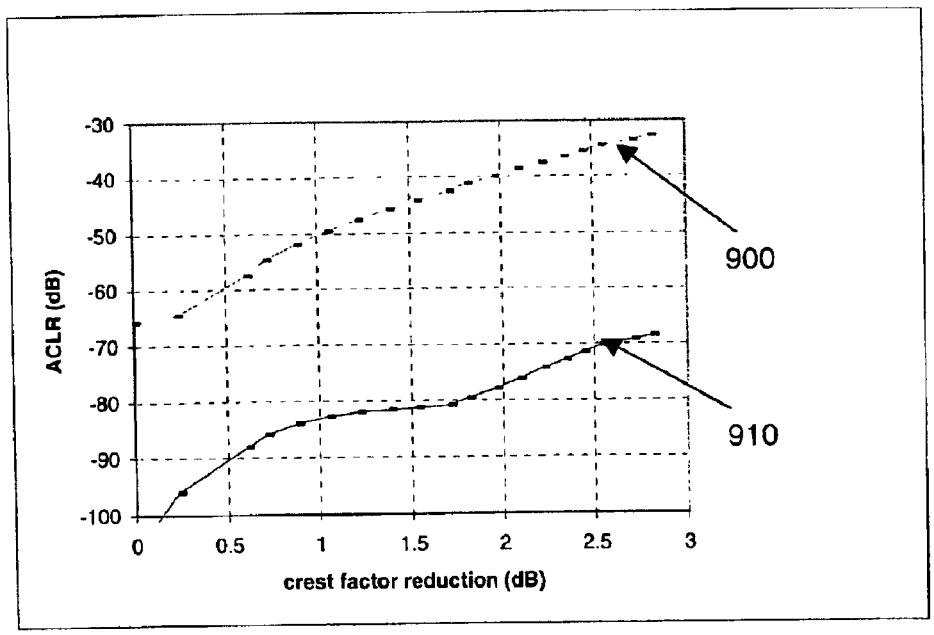
FIG. 9 shows a graph representing the impact of baseband clipping on ACLR measurements.

FIG. 9 shows the impact on ACLR from various levels of reduction in the crest factor. Curve 900 shows the ACLR figure for a channel 5 MHz from the transmit channel. Curve 910 shows the ACLR figure for a channel 10 MHz from the transmit channel.

Figure 10:
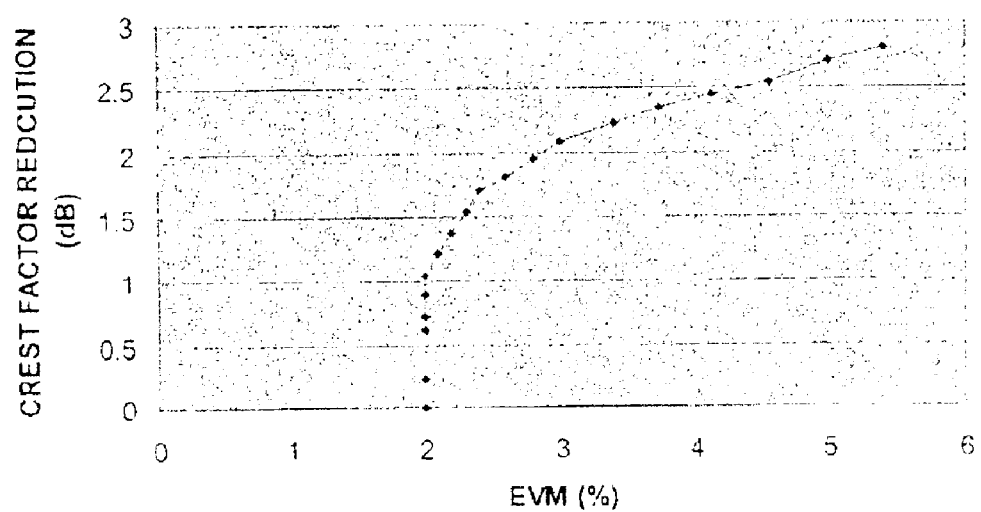
FIG. 10 shows a graph representing the effect of baseband clipping on EVM performance.

FIG. 10 shows a graph of the effect on EVM performance with a reduction in crest factor. It can be seen that as the crest factor is reduced by baseband clipping, the EVM performance is degraded. Note, however, that the degradation does not become significant until the crest factor has been reduced by approximately 1.5 dB.

Working from the graphs of FIGS. 8, 9 and 10, the necessary compromise can be struck between acceptable levels of ACLR and EVM performance achievable from a given level of Baseband clipping.

Although described in terms of the WCDMA communication protocol, it should be understood that the benefits afforded by embodiments of the invention may be realized by any modulation scheme producing a nonconstant envelope signal.

The present invention includes any novel feature or combination of features is disclosed herein either explicitly or any generalization thereof irrespective of whether or not it relates to the claimed invention or mitigates any or all of the problems addressed.

What is claimed is:

1. A transmitter including a RF portion including an amplifier for amplifying a signal for transmission, the RF portion being fed by a baseband portion, wherein the baseband portion comprises:
   means for generating a pair of in-phase (I) and quadrature-phase (Q) data signals;
   a limiter arrangement which prevents an amplitude of the I and Q data signals from exceeding a predetermined level; and
   means for providing phase rotation of the in-phase (I) and quadrature-phase (Q) data signals; and wherein
   an output of the means for phase rotation is coupled to an input of the limiter arrangement.

2. A transmitter as claimed in claim 1, wherein:
   the limiter comprises a pair of limiters for limiting the I and Q data signals respectively.

3. A portable telephone comprising:
   a transmitter as claimed in claim 2.

4. A portable telephone as claimed in claim 3, which operates according to the WCDMA communication standard.

5. A portable telephone as claimed in claim 4 which operates according to a FDD variant of WCDMA.

6. A portable telephone as claimed in claim 4 which operates according to a TDD variant of WCDMA.

7. A portable telephone as claimed in claim 4 which operates according to both FDD and TDD variants of the WCDMA communication standard.

8. A base station comprising:
   a transmitter as claimed in claim 2.

9. A base station as claimed in claim 8 which operates according to the WCDMA communication standard.

10. A base station as claimed in claim 9 which operates according to a FDD variant of WCDMA.

11. A base station as claimed in claim 9 which operates according to a TDD variant of WCDMA.

12. A base station as claimed in claim 9 which operates according to both FDD and TDD variants of the WCDMA communication standard.

13. A transmitter as claimed in claim 1 wherein the limiter arrangement comprises:
   a converter for converting the I and Q data signals into a pair of signals representing magnitude data and phase data of the signal for transmission;
   a limiter which limits the amplitude of the magnitude data signal from exceeding a predetermined level; and
   a converter for converting the limited magnitude data signal and phase data signal into a pair of I and Q data signals.

14. A portable telephone comprising:
   a transmitter as claimed in claim 13.

15. A portable telephone as claimed in claim 14, which operates according to the WCDMA communication standard.

16. A portable telephone as claimed in claim 15 which operates according to a FDD variant of WCDMA.

17. A portable telephone as claimed in claim 15 which operates according to a TDD variant of WCDMA.

18. A portable telephone as claimed in claim 15 which operates according to both FDD and TDD variants of the WCDMA communication standard.

19. A base station comprising:
   a transmitter as claimed in claim 13.

20. A base station as claimed in claim 19 which operates according to the WCDMA communication standard.

21. A base station as claimed in claim 20 which operates according to a FDD variant of WCDMA.

22. A base station as claimed in claim 20 which operates according to a TDD variant of WCDMA.

23. A base station as claimed in claim 20 which operates according to both FDD and TDD variants of the WCDMA communication standard.

24. A portable telephone comprising:

a transmitter as claimed in claim 1.

25. A portable telephone as claimed in claim 24, which operates according to the WCDMA communication standard.

26. A portable telephone as claimed in claim 25 which operates according to a FDD variant of WCDMA.

27. A portable telephone as claimed in claim 25 which operates according to a TDD variant of WCDMA.

28. A portable telephone as claimed in claim 25 which operates according to both FDD and TDD variants of the WCDMA communication standard.

29. A base station comprising:

a transmitter as claimed in claim 1.

30. A base station as claimed in claim 29 which operates according to the WCDMA communication standard.

31. A base station as claimed in claim 30 which operates according to a FDD variant of WCDMA.

32. A base station as claimed in claim 30 which operates according to a TDD variant of WCDMA.

33. A base station as claimed in claim 30 which operates according to both FDD and TDD variants of the WCDMA communication standard.

* * * * *